US008996968B2

(12) United States Patent
Jiang et al.

(10) Patent No.: US 8,996,968 B2
(45) Date of Patent: Mar. 31, 2015

(54) METHOD, APPARATUS AND DECODER FOR DECODING CYCLIC CODE

(71) Applicant: International Business Machines Corporation, Armonk, NY (US)

(72) Inventors: Guofan Jiang, Shang Hai (CN); Yufei Li, Shang Hai (CN); Zhi Gui Liu, Shang Hai (CN); Yang Liu, Shang Hai (CN); Fan Zhou, Shang Hai (CN)

(73) Assignee: International Business Machines Corporation, Armonk, NY (US)

( * ) Notice: Subject to any disclaimer, the term of this patent is extended or adjusted under 35 U.S.C. 154(b) by 258 days.

(21) Appl. No.: 13/705,528

(22) Filed: Dec. 5, 2012

(65) Prior Publication Data

US 2013/0159819 A1 Jun. 20, 2013

(30) Foreign Application Priority Data

Dec. 19, 2011 (CN) .......................... 2011 1 0427968

(51) Int. Cl.
*H03M 13/00* (2006.01)
*H03M 13/09* (2006.01)
*H03M 13/15* (2006.01)

(52) U.S. Cl.
CPC .......... *H03M 13/09* (2013.01); *H03M 13/1595* (2013.01)
USPC ........... 714/785; 714/752; 714/755; 714/758; 714/762

(58) Field of Classification Search
USPC .......................... 714/762, 785, 752, 755, 758
See application file for complete search history.

(56) References Cited

U.S. PATENT DOCUMENTS

| 5,329,535 | A   | * | 7/1994  | Coker ........................... 714/762 |
| 6,321,357 | B1  |   | 11/2001 | Ouyang |
| 6,378,103 | B1  |   | 4/2002  | Han |
| 7,904,794 | B2  |   | 3/2011  | Park et al. |
| 7,962,839 | B1  |   | 6/2011  | Wu |
| 7,992,069 | B2  |   | 8/2011  | Miyata et al. |
| 8,010,880 | B2  |   | 8/2011  | Ko et al. |
| 2004/0003334 | A1 |   | 1/2004  | Boyanapalli |
| 2009/0070656 | A1 |   | 3/2009  | Jo et al. |
| 2009/0193314 | A1 |   | 7/2009  | Melliar-Smith et al. |
| 2010/0241933 | A1 | * | 9/2010  | Latremouille ................ 714/785 |
| 2010/0275088 | A1 |   | 10/2010 | Graef |

OTHER PUBLICATIONS

Bardis et al. "Double Burst Error Correction Method: Case of Interference Incidents during Data Transmission in Wired Channels", 5th IEEE International Conference on Digital Ecosystems and Technologies (IEEE DEST 2011), May 31-Jun. 3, 2011, pp. 192-196.
Ye et al. "A Novel Forward Error Correction Decoding Structure for 10G/40G Ethernet", 2010 International Conference on Computer Design and Applications (ICCDA 2010), vol. 5, 2010 IEEE, pp. V5-363-V5-366.

* cited by examiner

*Primary Examiner* — Sam Rizk
(74) *Attorney, Agent, or Firm* — Patricia B. Feighan; Joseph Petrokaitis (57) ABSTRACT

A method, apparatus and decoder for decoding cyclic code are proposed. The decoding method comprises: receiving a transmitted cyclic code; calculating the initial syndrome of the cyclic code; by using the initial syndrome and w prestored successive shift operators, calculating respectively w successive shift syndromes in a w-bit window of the cyclic code in parallel; and detecting/locating error in the cyclic code based on the obtained syndromes. The decoding apparatus corresponds to the above method. And the corresponding decoder is also proposed in this invention. The method, apparatus and decoder according to the invention could process the cyclic code within a window width and thus enhance decoding efficiency in parallel.

20 Claims, 6 Drawing Sheets

METHOD, APPARATUS AND DECODER FOR DECODING CYCLIC CODE

CLAIM OF PRIORITY

The present application claims the benefit of priority of CN patent application 201110427968.9, entitled "METHOD, APPARATUS AND DECODER FOR DECODING CYCLIC CODE", filed Dec. 19, 2011, with the Japanese Patent and Trademark Office, the content of which is incorporated herein by reference in its entirety.

TECHNICAL FIELD

The proposed invention relates to encoding and decoding of cyclic code, and more particularly, to method, apparatus and decoder for decoding cyclic code.

DESCRIPTION OF THE RELATED ART

The Cyclic Redundancy Check (CRC) code is widely used in error detecting and checking in communication domain. This kind of checking method generates the corresponding syndrome based on pre-defined generation algorithm, and appends the syndrome to the end of the original frame code, then to build the cyclic code. For the convenience of expression and calculation, the binary code is generally expressed in the form of a polynomial of x. In a typical way of expression, the highest power of x corresponds to the first bit of the binary code, and the subsequent bits correspond to respective powers of the polynomial. For performing Cyclic Redundancy Check, the two sides of communication have to predetermine a generator polynomial g(x); suppose its highest degree is R, and then the corresponding binary code has a length of R+1. Based on this generator, for a K-bit original information code m(x), an R-bit check code p(x) could be generated, which satisfies:

$$p(x)=x^R m(x) \bmod g(x)$$

That means, the syndrome p(x) is the remainder polynomial obtained by moving the original information code m(x) R-bit left, and then dividing it by the generator polynomial g(x). Subsequently, by merging the original information code m(x) and the generated syndrome p(x), the cyclic code c(x) can be obtained:

$$c(x)=x^R m(x)+p(x)$$

Therefore, the length of c(x) is N=K+R. Thus, such a cyclic code is generally expressed as c(N, K). The values of N and R determine the error correction capacity of the cyclic code.

After the cyclic code c(x) is sent, the receiver could obtain a received code r(x). In order to detect whether an error has been injected during the process of transmission, and to correct the error thereby restoring the original information code, the receiver needs to decode the received code r(x).

With the development of VLSI technology, more and more circuits are able to realize the decoding of the cyclic code. According to the prior art, however, after receiving data frame into local buffer, the decoding circuit generally needs to decode the data frame code bit by bit, which would take a lot of time and result in large latency. In addition, the current decoding methods only use part of the error correction capacity of the cyclic code, the cyclic code correction utilization is not efficient. Therefore, an improved decoding way is needed and desired to enhance the efficiency and/or accuracy of decoding and correction.

SUMMARY OF THE INVENTION

For the above problems, this invention is proposed to resolve at least one disadvantage existed in the prior art.

According to the first aspect, the proposed invention provides a method for decoding cyclic code, including: receiving a transmitted cyclic code; calculating the initial syndrome of the cyclic code; by using the initial syndrome and w pre-stored successive shift operators, calculating respectively w successive shift syndromes in a w-bit window of the cyclic code in parallel; and detecting error in the cyclic code based on the calculated syndromes.

According to the second aspect, the proposed invention provides an apparatus for decoding cyclic code, including: a receiving unit, configured to receive the transmitted cyclic code; an initial syndrome calculating unit, configured to calculate the initial syndrome of the cyclic code; a window processing unit, configured to, by using the initial syndrome and w pre-stored successive shift operators, calculate respectively w successive shift syndromes in a w-bit window of the cyclic code in parallel; and an error detecting unit, configured to detect error in the cyclic code based on the obtained syndromes.

According to the third aspect, the proposed invention provides a decoder for decoding cyclic code, including: a data buffer for storing received cyclic code and initial syndrome; a parallel computing circuit, including w multipliers, for applying w pre-stored successive shift operators to the initial syndrome, and thus outputting in parallel w successive shift syndromes in a w-bit window of the cyclic code; and an error detecting circuit, including a zero detecting module, for detecting the number of zeros in the syndromes and outputting the error pattern based on the detecting result.

The method, apparatus and decoder according to embodiments of the invention can process in parallel the cyclic code within the width of a window, thereby improving decoding efficiency. Furthermore, the embodiments of the invention may further improve the rate and/or accuracy of decoding.

DETAILED DESCRIPTION OF THE PREFERRED EMBODIMENT

It could be well known by the technician in this domain, the aspects of the proposed invention could be implemented as a system, method or computer program product. Accordingly, aspects of the invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the invention may take the form of a computer program product embodied in one or more computer readable medium having computer usable program code embodied in the medium.

Any combination of one or more computer readable medium could be used. The computer readable medium may be computer-readable signal medium or computer-readable storage medium. The computer-readable storage medium may be, for example but not limited to, an electronic, magnetic, optical, electromagnetic, infrared, or semiconductor system, apparatus, device or any combinations thereof. More specific examples (a non-exhaustive list) of the computer-readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device or any proper combinations thereof. In the context of this document, a computer-readable storage medium may be any tangible medium that can contain, or store the program for use by or in connection with the instruction execution system, apparatus, or device.

Computer readable signal medium may include a propagated data signal with the computer-readable program code embodied therewith, either in baseband or as part of a carrier wave. Such propagated signal may use any proper form, including but not limited to, electromagnetic signal, optical signal, or any proper combination thereof. Computer readable signal medium may be any computer readable medium that is different from computer-readable storage medium and can communicate, propagate, or transport the program for use by or in connection with the instruction execution system, apparatus, or device.

Program code included in the computer readable medium may be transmitted using any appropriate medium, including but not limited to wireless, wireline, optical fiber cable, RF, etc. or any proper combination thereof.

Computer program code for carrying out operations of the proposed invention may be written in any combination of one or more programming languages, including an object oriented programming language such as Java, Smalltalk, C++ or the like and conventional procedural programming languages, such as "C" programming language or similar programming languages. The program code may execute entirely on a user computer, partly on a user computer, as a stand-alone software package, partly on user computer and partly on a remote computer or entirely on a remote computer or server. In the latter scheme, the remote computer may be connected to the user computer through any type of network, including a local area network (LAN) or a wide area network (WAN), or the connection may be made to an external computer (for example, through the Internet using an Internet Service Provider).

Below aspects of the invention will be described with reference to flowchart and/or block diagram of methods, apparatuses (systems) and computer program products of the embodiment of the invention. Note that, each block of the flowchart and/or block diagram, and combinations of blocks in the flowchart and/or block diagram, can be implemented by computer program instructions. These computer program instructions may be provided to a processor of a general-purpose computer, a special-purpose computer or other programmable data processing apparatus to produce a machine, such that the instructions which execute on the computer or other programmable data processing apparatus create means for implementing the functions/actions specified in the block(s) of the flowchart and/or block diagram.

These computer program instructions may also be stored in a computer-readable medium that can direct a computer or other programmable data processing apparatus to function in a particular manner, such that the instructions stored in the computer-readable medium produce an article of manufacture including instruction means which implement the functions/actions specified in the block(s) of the flowchart and/or block diagram.

The computer program instructions may also be loaded into a computer or other programmable data processing apparatus to perform a series of operational steps on the computer or other programmable data processing apparatus so as to produce computer implemented process, such that the instructions which execute on the computer or other programmable data processing apparatus will provide process for implementing the functions/actions specified in the block(s) of the flowchart and/or block diagram.

Next, the embodiments of the invention will be described in conjunction with the drawings and examples. It should be appreciated that the description of the following detailed examples are merely to explain the exemplary implementing modes, rather than to impose any limitation on scope of the invention.

In the embodiments of the invention, in order to improve the decoding efficiency, a slide window based decoding method is used to decode cyclic code. This decoding method may calculate simultaneously in parallel syndromes for the code positions within the window width of the cyclic code, and then check and correct errors contained in the window.

Figure 1:
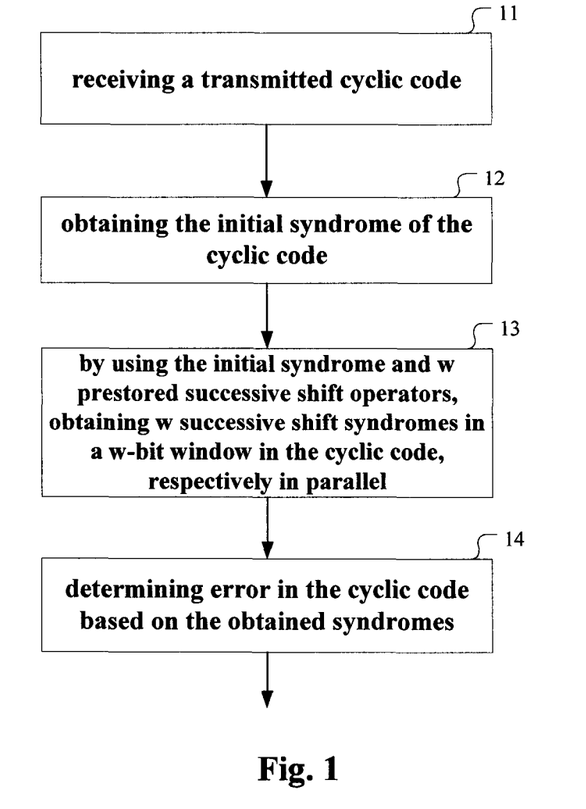
FIG. 1 is a flow chart showing a method for decoding cyclic code according to an embodiment of the invention.

FIG. 1 is the flow chart showing the method for decoding cyclic code according to an embodiment of the invention. As shown in FIG. 1, the method according to the embodiment includes the following steps: step 11 of receiving a transmitted cyclic code; step 12 of obtaining the initial syndrome of the cyclic code; step 13 of, by using the initial syndrome and w pre-stored successive shift operators, calculating respectively w successive shifted syndromes in a w-bit window of the cyclic code in parallel; and step 14 of detecting error in the cyclic code based on the obtained syndromes. Next, the implementing modes of the above steps will be described in conjunction with detailed examples of cyclic code.

Suppose that the sending side generates a cyclic code c(x) through cycle encoding of the original information based on a generator polynomial g(x), and then sends the code c(x) to the receiving side. During the process of code transmission, suppose that an error occurs on position j of the transmitted code c(x): $E(x)=e_0+e_1x+e_2x^2+\ldots+e_{L-1}x^{L-1}$. Thus, the code r(x) that the receiving side receives may be expressed as:

$$r(x)=c(x)+x^jE(x)_o \qquad (1)$$

Therefore, in step 11, the process obtains the transmitted cyclic code r(x). In one embodiment, it obtains the code of the entire data frame, and stores it into the local buffer. In the field of communication, when a binary code is expressed as a polynomial, the high power of x usually correspond to the right side code of the binary code, that is, the received cyclic code r(x) may be expressed in the following two forms:

$$r(x)=r_0r_1r_2\ldots r_{n-1}=r_0+r_1x+r_2x^2+\ldots+r_{n-1}x^{n-1} \qquad (2)$$

where $r_i$ is 0 or 1. Accordingly, multiplying the cyclic code by $x^i$ means i-bit cyclic shift of the code toward right side, and multiplying the cyclic code by $x^{-i}$ means i-bit cyclic shift of the code toward left side.

Based on the obtained cyclic code r(x), the process may in step 12 obtain the initial syndrome of the cyclic code.

Those technician in the domain could understand that, the remainder polynomial calculated by dividing the received code r(x) by the generator polynomial g(x) is referred to as syndrome polynomial S(x), i.e.:

$$S(x)=r(x) \bmod g(x) \qquad (3)$$

Therefore, the degree of S(x) is certainly lower than that of g(x), that is, S(x) is a polynomial of degree n−k−1 or less. In step 12, the syndrome polynomial may be calculated starting from any position of the cyclic code r(x), and the syndrome obtained at the starting point is regarded as the initial syndrome. Generally, the initial syndrome is calculated at the starting position $r_0$ of the received cyclic code, and in this case the initial syndrome may be expressed as $S_0(x)$. However, the calculation of the initial syndrome is not limited to the case of starting from $r_0$.

Based on the calculated initial syndrome, the process may further calculate the shift syndromes, which are syndromes obtained when the cyclic code r(x) is cyclically shifted. For example, $S_i(x)$ represents the syndrome obtained by using formula (3) after an i-bit cyclic shift of the original r(x) toward right side. Although the shift syndrome may be obtained directly by the shift of r(x), however, it is more convenient to use the syndrome character of cyclic code, for example, the Meggitt theorem. According to the theorem, for i>=0, $$S_{i+1}(x)=[xS_i(x)] \bmod g(x) \qquad (4)$$

Therefore, after calculating the syndrome $S_i$, it could easily get the next shift syndrome $S_{i+1}$ by using the above formula (4). Thus, based on the initial syndrome $S_0$ obtained in step 11, shift syndromes $S_1(x), S_2(x), S_3(x), \ldots, S_{n-1}(x)$ may be easily calculated one by one.

In order to calculate syndromes more rapidly and more effectively, in step 13, the process constructs a slide window with width of w bits, and obtains shift syndromes in the range of the window width of the cyclic code, respectively in parallel, by using the initial syndrome and w pre-stored successive shift operators.

In particular, for a given generator polynomial g(x), the operation of $x^i \bmod g(x)$ may be calculated in advance, where 1<=i<=w. The calculating results may be regarded as shift operators and stored into w computational units, respectively. When carrying out step 13, the process sends the initial syndrome simultaneously to the w computational units, such that the computational units combine the initial syndrome with the shift operators stored therein, thereby obtaining the corresponding shift syndromes. For example, by combining the initial syndrome $S_0$ with the shift operators $x^i \bmod g(x)$, respectively, in the w computational units, shift syndromes $S_1(x), S_2(x), S_3(x), \ldots, S_w(x)$ can be obtained respectively in parallel. Subsequently, regarding $S_w(x)$ as the initial syndrome, the process performs calculation by using these shift operators once again, and can thus obtain $S_{1+w}(x), S_{2+w}(x), S_{3+w}(x), \ldots, S_{2w}(x)$, which is equivalent to the operation of shifting the window once toward right side. By shifting the window through the cyclic code like this, it may obtain all the shift syndromes $S_1(x), S_2(x), S_3(x), \ldots, S_{n-1}(x)$ as desired.

It can be seen that, in the case of window based syndrome calculation, the process may generate a w-bit output once, which output is not dependent on the size of the frame data, and is only related to the width of the window. As parallel calculation is performed for shift syndromes, the decoding efficiency may be improved significantly.

In computer systems, considering bus widths, the window width w is generally defined as a power of 2, i.e., $w=2^b$.

On the other hand, the cyclic code has a feature $x^i S(x)= x^{-(n-i)} S(x)$, that is, for a cyclic code, the results are the same in the case of i-bit right shift and in the case of (n−i)-bit left shift. Therefore, in one embodiment, the process may regard $x^{-i} \bmod g(x)$ (where 1<=i<=w) as shift operators, that is to obtain and store the shift operators of left shift. Accordingly, in step 13, the process combines the initial syndrome simultaneously with the w operators of left shift, and therefore obtains the corresponding shift syndromes of left shift. For example, by combining the initial syndrome $S_0$ with the shift operators $x^{-i} \bmod g(x)$, it may obtain $S_{-1}(x), S_{-2}(x), S_{-3}(x), \ldots, S_{-w}(x)$, respectively in parallel. By further shifting the window, it may likewise obtain all the shift syndromes of the cyclic code.

Based on the obtained shift syndromes, the process may judge and correct errors in the cyclic code, that is to perform step 14. The principle for determining errors may be explained as follows.

By combining the formulas (1) and (3), we can obtain:

$$S(x)=r(x) \bmod g(x)=[c(x)+E(x)] \bmod g(x) \qquad (4)$$

Obviously, according to the encoding principle of c(x), the remainder of dividing c(x) by g(x) is 0. Therefore, formula (4) may be further written as:

$$S(x)=c(x) \bmod g(x)+x^j E(x) \bmod g(x)=x^j E(x) \bmod g(x) \qquad (5)$$

Furthermore, according to the feature of cyclic code, formula (5) may be written as:

$$x^{-j} S(x)=x^{n-j} S(x)=E(x) \qquad (6)$$

According to the Meggitt theorem, for the obtained syndromes S(x), if the distance between the first 1 and the last 1 in the binary code of a syndrome (also referred to as the maximum code distance) is less than or equal to the error length L that the cyclic code is able to correct, it can be considered that the syndrome S(x) corresponds to the error polynomial E(x), and the position j where the syndrome is calculated is the position j where an error occurs. Thus, the syndromes obtained in step 12 may be judged one by one so as to obtain the error pattern E(x) and the error position j.

As described above, the length of the syndrome is n−k−1, while the length of the error is L. Based on that, the judgment of errors may be simplified. In one embodiment, the content to be checked is whether the first n−k−L−1 bits or the last n−k−L−1 bits in the syndrome S(x) are all 0; if so, 1 can only occur in the remaining L bits, then the distance between the first 1 and the last 1 is necessarily less than or equal to L, and thus the syndrome S(x) may possibly correspond to an error pattern E(x).

After calculating the error pattern and the error position, the process may correct the error in the cyclic code. Therefore, the method of FIG. 1 further includes the step of correcting the error (not shown). For example, if $S_j(x)=E(x)$ is determined, the process may stop at the position j, do XOR operation on the received data code r(x) with E(x), and thereby correcting the burst error.

Thus, according to steps 11-14 of FIG. 1, the process simultaneously calculates a plurality of successive syndromes in the range of the window in parallel, and checks and corrects errors based on these syndromes.

Based on that, in one embodiment, a step of predicting error is further introduced to speed up the decoding process. The purpose of error prediction is to exclude the rounding side effect that may be caused by the slide window based method.

Figure 2:
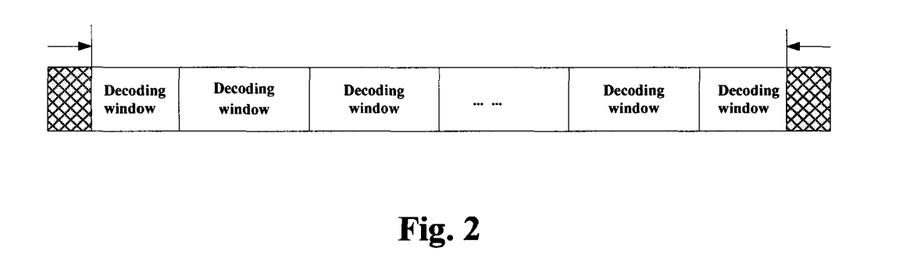
FIG. 2 is a schematic diagram showing the rounding side effect in the case of slide window.

FIG. 2 is a schematic diagram showing the rounding side effect in the case of slide window. In one case, errors occur in the codes adjacent to both the beginning and the end of the data frame. Because of the cyclic characteristic of the cyclic code, the errors in the beginning and the end would be considered as a string of general errors that round from the end of the cyclic code to the beginning. This case may be referred to as the rounding side effect. FIG. 2 particularly shows the case in which the error pattern covers the first window and the last window, wherein the dash area shows the code segments including errors. In the case of FIG. 2, the error in the first window and the error in the last window may be jointly considered as a string of errors that round from the last window to the first window. Thus, based on steps 11-14 of FIG. 1, a step of predicting error is further introduced to avoid the rounding side effect.

In particular, while processing the first window, the method may calculate the last L−1 bits, that is, to predict the possible error adjacent to the end of the cyclic code. The syndromes corresponding to the last L−1 bits are $S_{-(n-L+1)}(x)$, $S_{-(n-L+2)}(x)$, $S_{-(n-L+3)}(x)$, . . . , $S_{-(n-1)}(x)$. According to the cyclic characteristic, the syndromes may also be expressed as $S_{L-1}(x)$, $S_{L-2}(x)$, $S_{L-3}(x)$, . . . , $S_1(x)$. In order to calculate these syndromes, a process similar to step 12 may be employed. That is to calculate in advance the shift operators $x^i$ mod g(x), $1<=i<=L-1$, and obtain $S_1(x)$, $S_2(x)$, $S_3(x)$, . . . , $S_{L-1}(x)$ by applying the shift operators to S(x). Based on the obtained syndromes, the process can predict and estimate whether errors may possibly occur in the last L−1 bits.

In another embodiment, the process may calculate the first L−1 bits, that is, to predict the possible error adjacent to the beginning position of the cyclic code. Similarly, it may in advance calculate the shift operators $x^{-i}$ mod g(x), $1<=i<=L-1$, obtain $S_{-1}(x)$, $S_{-2}(x)$, $S_{-3}(x)$, . . . , $S_{-L+1}(x)$ by applying the shift operators to S(x) and test these syndromes.

By calculating in advance the beginning and/or the end of the cyclic code, the process may find and exclude the rounding side effect ahead of time. Once the rounding side effect is excluded, it may output the decoding results while shifting the window, thereby realizing rapid decoding. In the case of no rounding side effect, if an error is detected in a window and the error can be corrected, the decoding process may directly output the corrected result in the window; otherwise, it continues calculating $S_{-w}(x)$, $S_{-w-1}(x)$, $S_{-w-2}(x)$, . . . , $S_{-w*2+1}(x)$, until all bits in the data frame are checked. Thus, the decoding latency is only dependent on the size of the window. As the decoding results can be immediately outputted without the necessity of waiting for the completion of processing all the windows, the decoding latency is further reduced, and the efficiency is further enhanced.

Based on the window sliding method, in one embodiment, a step of estimating most likelihood error is further introduced to make better use of the decoding capacity of the cyclic code, and improve decoding accuracy.

Currently, most decoding circuits and apparatus only utilize a part of the decoding capacity of the cyclic code. In the field of communication, there is an industry standard for the error rate of the communication transmission. According to the requirement of the industry standard, for a certain type of cyclic code C(n, k), the error length L that can be decoded is prescribed. However, actually, errors having a length of L have only $n*(2^L-1)$ types, while the cyclic code C(n, k) has $2^{n-k}-1$ correction patterns. The prescribed correctable errors generally make up only a small part of the entire error patterns that can be corrected by the cyclic code. For example, according to the error rate standard, the Forward Error Correction Code FEC (2112, 2080) has the ability of correcting 11-bit burst errors. However, the number of burst errors is only $2112*(2^{11}-1) \approx 2^{22}$, while the number of the error patterns that can be corrected by the cyclic code is $2^{32}$. It can be seen that most existing decoding apparatus only exploit one thousandth of the error correction capability of the cyclic code. Thus, the step of estimating most likelihood error is introduced herein to make better use of the decoding capacity of the cyclic code, and expand its correction capacity to a higher degree.

In particular, according to steps 13 and 14 of FIG. 1, the process may obtain a plurality of syndromes in the range w of the window in parallel. For the obtained syndromes, if the maximum code distance of the binary code of a syndrome is less than or equal to the prescribed error length L, it can be considered that an error is detected and the error pattern corresponds to the expression of the syndrome. Correction of the cyclic code may be conducted based on the detected error. However, if the maximum code distance of the syndrome is larger than the prescribed error length L, generally it will be considered that an uncorrectable error is detected. At this time, the existing decoding methods would send a signal, notifying that an uncorrectable error is detected. However, according to the step of estimating most likelihood error in the embodiment, when this condition occurs, the process not only sends a signal of an uncorrectable error detected, but also provides most likelihood result of error correction.

In order to get the most likelihood result of error correction, in step 12, the process obtains the shift syndromes corresponding to each candidate position by shifting the window through the entire data frame. Subsequently, it compares all the shift syndromes, and selects the shortest shift syndrome. The shortest shift syndrome is the syndrome having the least maximum code distance. Then, the process estimates the error code in the cyclic code according to the shortest shift syndrome, that is, the error pattern corresponding to the shortest syndrome is considered as most likelihood error. Accordingly, the correction result obtained based on the most likelihood error is the most likelihood result of error correction.

It can be seen that, most likelihood decoding process will not make judgment until every bit of the entire cyclic code is tested, and therefore, its decoding rate may be slower than the mode of outputting decoding results while shifting the window. However, most likelihood decoding method expands the error length that can be decoded by the cyclic code from L to a number larger than L, and thus, it makes better use of the decoding capacity of the cyclic code, improves decoding accuracy, and enhances decoding efficiency from another aspect.

From the above paragraphs, according to the embodiments of the invention, the concept of slide window is proposed, which can obtain syndromes in the window width of the cyclic code simultaneously in parallel, thereby enhancing decoding efficiency. Based on the slide window method, the step of error prediction and the step of most likelihood decoding may be selectively introduced to further improve the decoding rate or accuracy.

Figure 3:
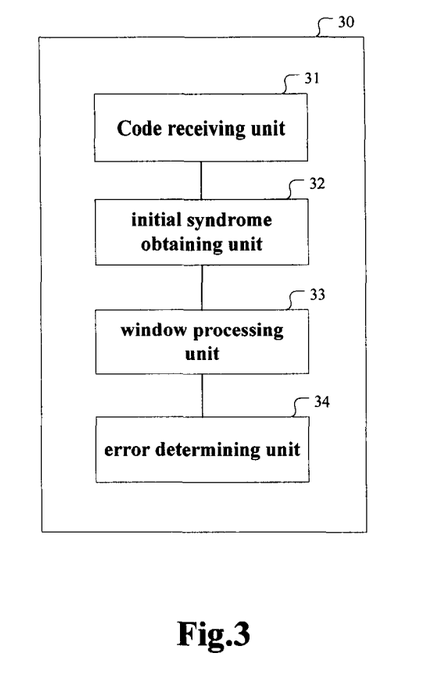
FIG. 3 is a block diagram showing an apparatus for decoding cyclic code according to an embodiment of the invention.

Based on the same inventive concept, the embodiments of the invention further provide an apparatus for decoding cyclic code. FIG. 3 is a block diagram showing an apparatus for decoding cyclic code according to an embodiment of the invention. As shown in FIG. 3, the apparatus is generally labeled as 30. In particular, the apparatus 30 may include: a code receiving unit 31, configured to receive a transmitted cyclic code; an initial syndrome obtaining unit 32, configured to obtain the initial syndrome of the cyclic code; a window processing unit 33, configured to, by using the initial syndrome and w prestored successive shift operators, obtain respectively in parallel w successive shift syndromes in a w-bit window of the cyclic code; and an error determining unit 34, configured to determine error code in the cyclic code based on the obtained syndromes.

In one embodiment, the window processing unit 33 pre-stores $x^i$ mod $g(x)$ as the shift operators, where i=1, 2, . . . , w, and $g(x)$ is the generator polynomial of the cyclic code. In another embodiment, the window processing unit 33 pre-stores $x^{-i}$ mod $g(x)$ as the shift operators to obtain w shift syndromes in parallel.

In one embodiment, the apparatus 30 further includes an error predicting unit (not shown), configured to estimate in advance errors adjacent to the beginning and/or the end of the cyclic code, so as to exclude the rounding side effect that may possibly be caused by the slide window decoding way. In one example, the error predicting unit obtains in advance the shift syndromes corresponding to the first L−1 bits of the cyclic code, and determines the error adjacent to the beginning of the cyclic code based on the obtained shift syndromes, wherein L is the error length corresponding to the cyclic code. In another example, the error predicting unit obtains in advance the shift syndromes corresponding to the last L−1 bits of the cyclic code, and determines the error adjacent to the end of the cyclic code based on the obtained shift syndromes, wherein L is the error length corresponding to the cyclic code. By this way, the error predicting unit estimates in advance errors in the last L−1 bits of the cyclic code, and thus excludes errors adjacent to the end.

In one embodiment, the apparatus 30 further includes an error estimating unit (not shown), configured to estimate most likelihood error in the cyclic code. In particular, after the window processing unit 33 obtains all shift syndromes corresponding to the cyclic code by shifting the window, the error estimating unit compares all shift syndromes, selects the shortest shift syndrome therefrom, and estimates the most likelihood error code in the cyclic code according to the shortest shift syndrome. By using the estimating unit, the apparatus 30 may make better use of the decoding capacity of the cyclic code.

The detailed implementing mode of the apparatus 30 is omitted herein for it is similar to that of the method of FIG. 1, which has been described in conjunction with detailed examples of cyclic code.

It can be understood that, in one embodiment, the method of FIG. 1 and the apparatus of FIG. 3 may be realized mainly in the way of software code. Alternatively, in other embodiments, the above method and apparatus may also be realized by combining hardware with software.

According to another aspect of the invention, the effective decoding of cyclic code may also be realized mainly in the form of hardware. Thus, the embodiments of the invention further provide a decoder for decoding cyclic code.

Figure 4:
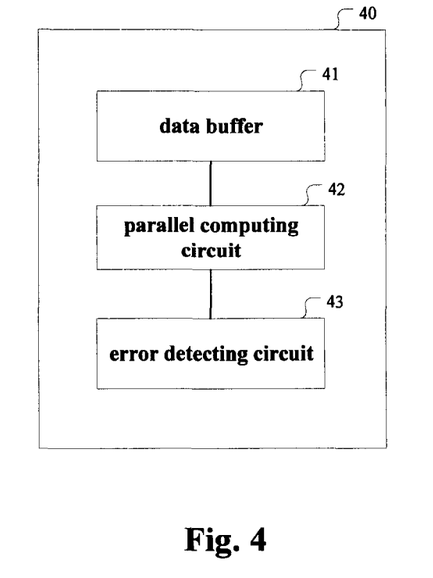
FIG. 4 shows the general structure of a decoder according to an embodiment of the invention.

FIG. 4 shows the general structure of a decoder according to an embodiment of the invention. As shown in FIG. 4, the decoder 40 includes a data buffer 41, a parallel computing circuit 42 and an error detecting circuit 43.

The data buffer 41 is used for storing received cyclic code. In one embodiment, the initial syndrome $S(x)$ is a check pattern extracted from the stored data frame, and may also be stored in the buffer 41. In another embodiment, the initial syndrome is calculated by a circuit, and then stored in the buffer 41. The structure of the data buffer 41 is similar to the structure of buffers in the prior art, and thus is not described in detail herein.

Figure 5A:
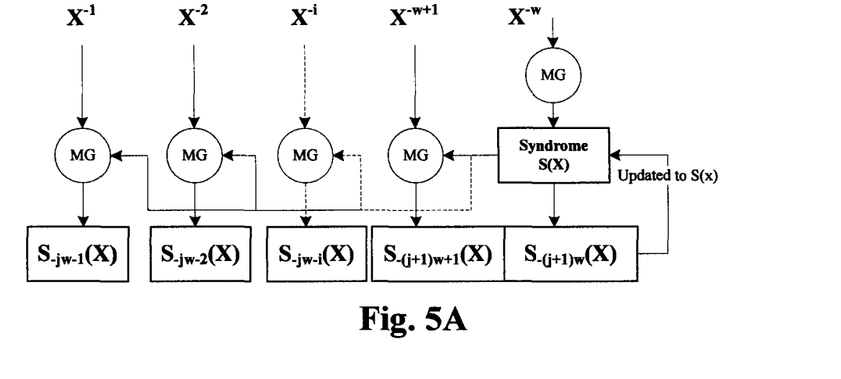
FIG. 5A and FIG. 5B show two exemplary structures of the parallel computing circuit.
Figure 5B:
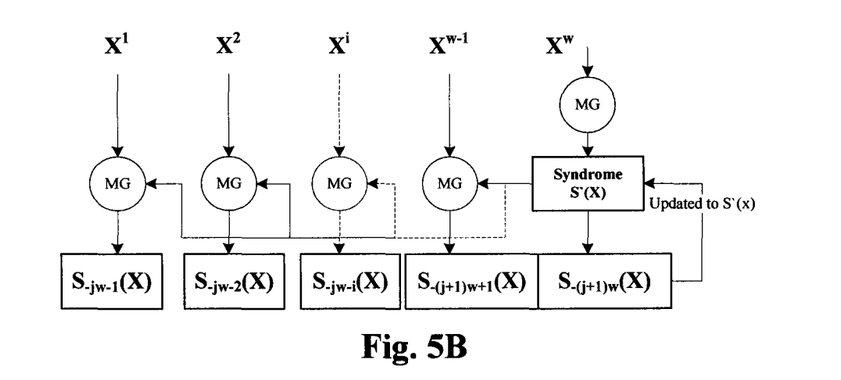

FIG. 5A and FIG. 5B show two exemplary structures of the parallel computing circuit 42.

The parallel computing circuit shown in FIG. 5A is used to calculate syndromes from the beginning to the end of cyclic code. In particular, the parallel computing circuit includes w multipliers for performing operation of the initial syndrome and shift operators. It can be understood that w is the width of window, and is the number of syndromes that can be obtained simultaneously by the parallel computing circuit. In the detailed example of FIG. 5A, the multiplier is MG multiplier unit, i.e., Galois Field multiplier unit. However, it can be understood that, in other examples, other particular multiplier units may also be employed to realize the operation on shift operators.

As described above, once $g(x)$ is given, $x^{-1}, x^{-2}, x^{-3}, \ldots, x^{-w}$ as well as $x^{-i}$ mod $g(x)$ may be calculated in advance. Each MG multiplier applies $x^{-i}$ mod $g(x)$ to the obtained initial syndrome $S(x)$, thus obtaining $S_{-i}(x)$. In the first round of iteration, j=0, and the initial syndrome $S(x)=S_0(x)$. By the operation of w MG multipliers, $S_0(x)$, $S_{-1}(x)$, $S_{-2}(x)$, $S_{-3}(x)$, . . . , $S_{-w+1}(x)$ may be obtained in parallel. In the second round of iteration, j=1, and the initial syndrome is updated to $S_{-w-1}(x)$. Similarly, by operation of MG multipliers, $S_{-w}(x)$, $S_{-w-1}(x)$, $S_{-w-2}(x)$, $S_{-w-3}(x)$, . . . , $S_{-2w+1}(x)$ are obtained in parallel. By repeating like this, the parallel computing circuit obtains $S_{-jw-1}(x)$, $S_{-jw-2}(x)$, $S_{-jw-3}(x)$, . . . , $S_{-(j+1)w}(x)$ in parallel for many times, until all bits of the cyclic code have been calculated.

Similarly, the parallel computing circuit shown in FIG. 5B is used to calculate syndromes from the end to the beginning of the cyclic code. In the detailed example of FIG. 5B, w MG multipliers are likewise employed to realize the shift operating calculation on the initial syndrome.

As described above, once $g(x)$ is given, $x^1, x^2, x^3, \ldots, x^w$ as well as $x^i$ mod $g(x)$ may be calculated in advance. Each MG multiplier applies $x^i$ mod $g(x)$ to the obtained initial syndrome $S(x)$, thus obtaining $S_i(x)$. Suppose the length of the cyclic code is N, then N=j*(W+1) when j has its maximum value. Since the calculation starts from the end of the cyclic code, in the first round of iteration, the initial syndrome $S(x)=S_{-(j+1)w}(x)$. By the operation of w MG multipliers, $S_{-jw-1}(x)$, $S_{-jw-2}(x)$, $S_{-jw-3}(x)$, $S_{-jw-4}(x)$, . . . , $S_{-(j+1)w}(x)$ may be obtained in parallel. In the second round of iteration, j=j−1, and the initial syndrome is updated to $S_{-jw}(x)$. Similarly, by the operation of MG multipliers, $S_{-(j+1)w-1}(x)$, $S_{-(j+1)w-2}(x)$, $S_{-(j+1)w-3}(X)$, $S_{-(j+1)w-4}(x)$, . . . , $S_{-jw}(x)$ are obtained in parallel. By repeating like this, the parallel computing circuit obtains $S_{-jw-1}(x)$, $S_{-jw-2}(x)$, $S_{-jw-3}(x)$, . . . , $S_{-(j+1)w}(x)$ in parallel for many times, until all bits of the cyclic code have been calculated.

By using the parallel computing circuit shown in FIG. 5A or FIG. 5B, a plurality of successive syndromes within the window width w may be outputted in parallel. Based on these syndromes, judgment may be performed as to whether an error occurs in the window. Thus, the error detecting circuit 43 obtains from the parallel computing circuit 42 the output syndromes, and analyzes these syndromes so as to detect errors in the cyclic code.

Figure 6:
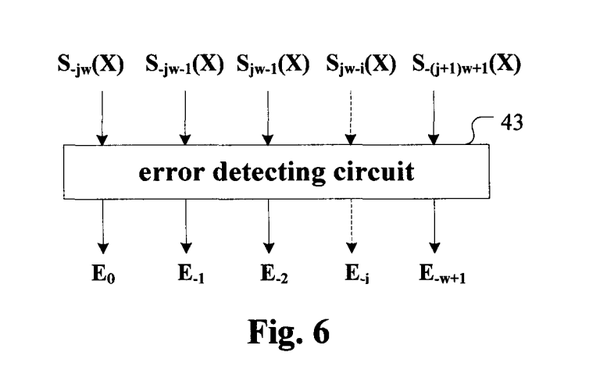
FIG. 6 shows the structure of an error detecting circuit according to an embodiment of the invention.

FIG. 6 shows the structure of an error detecting circuit according to an embodiment of the invention. The error detecting circuit obtains from the parallel computing circuit 42 a plurality of parallel output syndromes. According to the principle of cyclic code error determination, the error detecting circuit 43 mainly judges the position and number of 0 in the syndromes. In particular, the error detecting circuit 43 may include a zero detecting module for detecting whether the first n−k−L−1 bits or the last n−k−L−1 bits in $S(x)$ are all 0, and outputting the error position pattern $E_i$ based on the detecting result. The error position patterns $E_0, E_1, \ldots, E_{-w+1}$ correspond to the error positions 0, 1, 2, . . . , W−1 in the window. For example, $E_0=1$ means that the first error in the burst errors E(x) occurs at the first bit of the entire window. If no errors occur in the window, $E_0$, $E_1$, $E_{w+1}$ will all be zero in this iteration.

It can be understood that the decoder of FIG. 4 may further include an error correcting circuit (not shown). The error correcting circuit may obtain from the error detecting circuit 43 the error position patterns $E_i$, do XOR operations on the corresponding positions of the received cyclic code based on $E_i$, and thus correct the cyclic code.

In one embodiment, in order to further enhance the decoding rate, an error predicting circuit is introduced in the decoder to estimate in advance errors adjacent to the beginning and/or the end of the cyclic code, thus excluding the rounding side effect that may possibly be caused by the slide window.

Figure 7A:
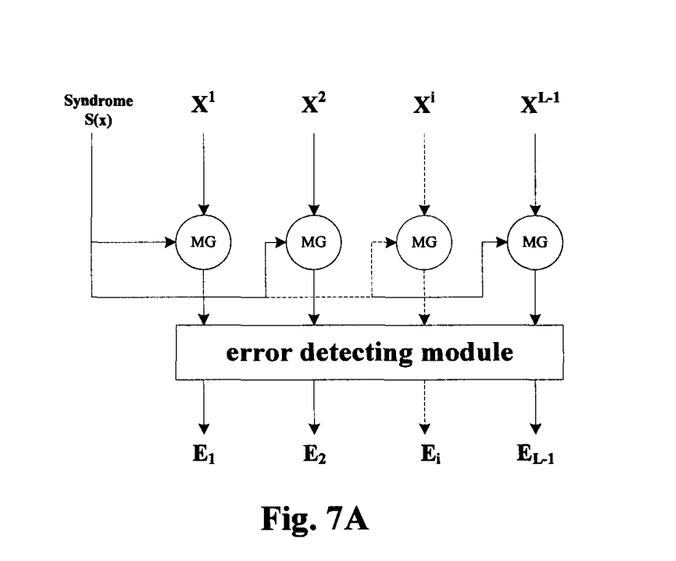
FIG. 7A and FIG. 7B show two exemplary structures of the error predicting circuit.
Figure 7B:
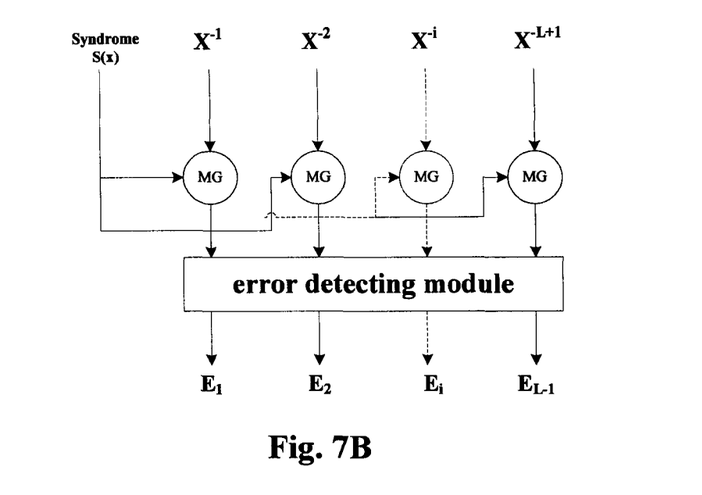

FIG. 7A and FIG. 7B show two exemplary structures of the error predicting circuit.

The error predicting circuit shown in FIG. 7A is used to estimate errors adjacent to the end of the cyclic code. The structure of the error predicting circuit is somewhat similar to that of the parallel computing circuit of FIG. 5A, and the difference is that, the error predicting circuit only performs calculation for the last L−1 bits of the cyclic code. In particular, the error predicting circuit includes L−1 multipliers for performing operation of syndromes and shift operators. Similarly, $x^1, x^2, x^3, \ldots, x^{L-1}$ as well as $x^i \mod g(x)$ are calculated in advance. By applying the above shift operators to the initial syndrome, $S_1(x), S_2(x), S_3(x), \ldots, S_{L-1}(x)$ may be obtained. The obtained syndromes are input into the error detecting module. The error detecting module may reuse the error detecting circuit 43 of FIG. 6, or may be another error detecting circuit having similar structure. The error detecting module analyzes the syndromes $S_1(x), S_2(x), S_3(x), \ldots, S_{L-1}(x)$, and outputs the error position patterns $E_1, E_2, \ldots, E_{L-1}$. Similarly, the error position patterns $E_1, E_2, \ldots, E_{L-1}$ correspond to the error positions N−1, N−2, ..., N−L+1. For example, $E_1=1$ means that the first error occurred in the burst error pattern is at position of (N−1)th bit of the entire code. If the first error does not occur in the last L bits of the cyclic code, $E_1, E_2, \ldots, E_{L-1}$ will all be zero.

Similarly, the error predicting circuit shown in FIG. 7B is used to estimate errors adjacent to the beginning of the cyclic code. In the error predicting circuit of FIG. 7B, $x^{-1}$, $x^{-2}$, $x^{-3}, \ldots, x^{-L+1}$ as well as $x^{-i} \mod g(x)$ are calculated in advance. By applying the above shift operators to the initial syndrome, $S_{-1}(x), S_{-2}(x), S_{-3}(x), \ldots, S_{-L+1}(x)$ may be obtained. The obtained syndromes are input into the error detecting circuit. Similarly, the error detecting circuit analyzes the syndromes $S_{-1}(x), S_{-2}(x), S_{-3}(x), \ldots, S_{-L+1}(x)$, and outputs the error position patterns $E_1, E_2, \ldots, E_{L-1}$. The error position patterns $E_1, E_2, \ldots, E_{L-1}$ correspond to the error positions 0, 1, ..., −L+1. For example, $E_1=1$ means that the first error in the burst error pattern is at position of the $1^{st}$ bit of the entire code. If the first error does not occur in the first L bits of the cyclic code, $E_1, E_2, \ldots, E_{L-1}$ will all be zero.

The above error detecting circuit may start working while the parallel computing circuit 42 processes the first window. After the error predicting circuit shown in FIG. 7A or 7B excludes the rounding side effect, the parallel computing circuit 42 and the error detecting circuit 43 can cooperate with each other, such that once syndromes in a window are obtained, the errors in this window can be output immediately, thus realizing error correction of cyclic code. Therefore, the decoding latency is shortened, and the decoding rate is further enhanced.

In one embodiment, in order to improve the decoding capacity of the decoder, an error estimating circuit is introduced in the decoder to estimate most likelihood error in the cyclic code, thereby making better use of the decoding capacity of the cyclic code and improving decoding accuracy.

Figure 8:
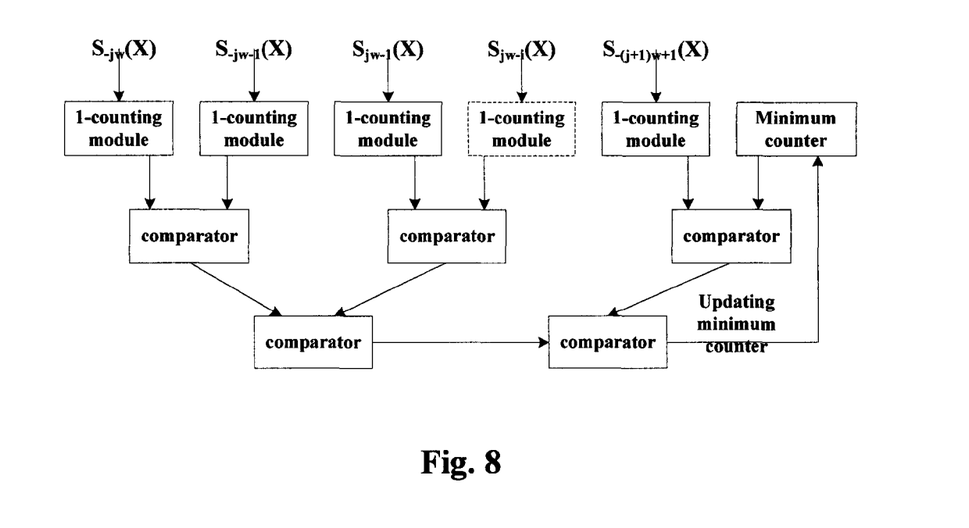
FIG. 8 shows the structure of an error estimating circuit according to an embodiment of the invention.

FIG. 8 shows the structure of an error estimating circuit according to an embodiment of the invention. The error estimating circuit is used to find from all syndromes the shortest syndrome, that is, the syndrome having the least maximum code distance. To this end, the error estimating circuit obtains from the parallel computing circuit 42 a plurality of the parallel output syndromes in a window, and inputs each syndrome into a 1-counting module. The 1-counting module is used to count the number of 1s in the input syndrome. The error estimating circuit further includes multiple comparators in several stages. The comparators perform comparison in several stages so as to find out the shortest syndrome in a window, which has the least number of 1s. The number of 1s in the shortest syndrome in the window is stored in a minimum counter for comparison with the shortest syndrome in the next window. Therefore, by performing comparison for many times, the error estimating circuit may find out the shortest syndrome from all the syndromes, and the error corresponding to the shortest syndrome is considered as the most likelihood error.

By using the above error estimating circuit, the decoder is able to estimate errors that exceed the standard error length L, and obtain most likelihood errors, thereby expanding the decoding space of the decoder.

It can be understood that, although the above shown decoder is realized mainly in the form of hardware, the invention does not exclude the case in which combination of hardware with software is employed in some circuits, units or modules of the decoder. In addition, the implementing modes of the decoder are not limited to the above detailed examples.

Figure 9:
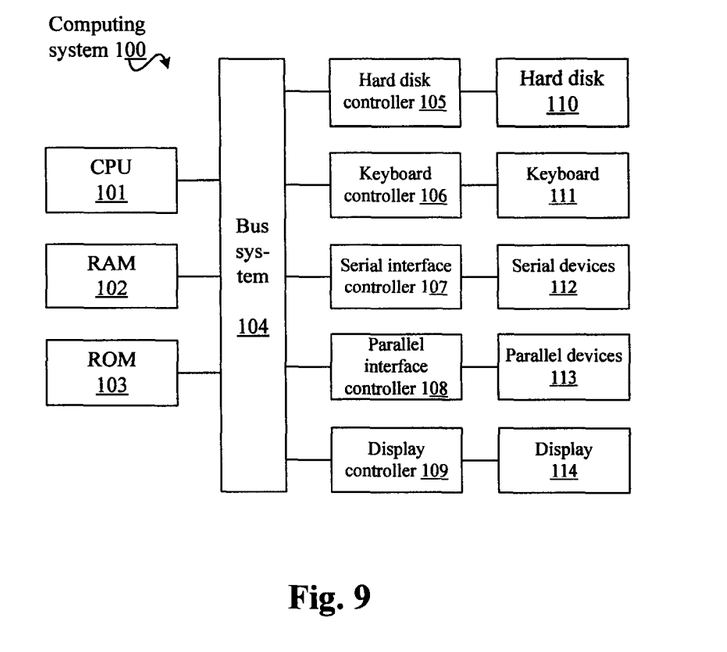
FIG. 9 is a block diagram showing an exemplary computing system suitable to implement the embodiments of the invention.

From above all, the embodiments of the invention provide method, apparatus and decoder for decoding cyclic code in many aspects. The method, apparatus and decoder may be realized in various ways. In one embodiment, the decoding method and apparatus as described above may be realized by using a computing system. FIG. 9 is a block diagram showing an exemplary computing system 100 suitable to implement the embodiments of the invention. As shown, the computer system 100 may include: a CPU (Central Processing Unit) 101, a RAM (Random Access Memory) 102, a ROM (Read-Only Memory) 103, a system bus 104, a hard disk controller 105, a keyboard controller 106, a serial interface controller 107, a parallel interface controller 108, a display controller 109, a hard disk 110, a keyboard 111, a serial external device 112, a parallel external device 113 and a display 114. Among these devices, the system bus 104 couples to the CPU 101, the RAM 102, the ROM 103, the hard disk controller 105, the keyboard controller 106, the serial controller 107, the parallel controller 108 and the display controller 109. The hard disk is coupled to the hard disk controller 105, the keyboard 111 is coupled to the keyboard controller 106, the serial external device 112 is coupled to the serial interface controller 107, the parallel external device 113 is coupled to the parallel interface controller 108, and the display 114 is coupled to the display controller 109. It is appreciated that, the structural block diagram shown in FIG. 9 is merely for purpose of illustration, rather than being a limitation to the scope of the invention. In some circumstances, certain devices may be added or removed based on actual condition.

The flowcharts and block diagrams in the accompany drawing illustrate the architecture, functionality, and operation of possible implementations of systems, methods and computer program products according to various embodiments of the proposed invention. In this regard, each block in the flowcharts or block diagrams may represent a module, segment, or portion of code, which includes one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Although respective apparatus and method of the proposed invention have been described in detail in conjunction with specific embodiments, the proposed invention is not limited thereto. Under teaching of the specification, various changes, replacements and modifications may be made to the invention by those skilled in the art without departing from the spirit and scope of the invention. It is appreciated that, all such changes, replacements and modifications still fall within the protection scope of the invention. The scope of the invention is defined by the appended claims.

The invention claimed is:

1. A method for decoding cyclic code using a decoder, comprising:
    receiving a transmitted cyclic code;
    calculating the initial syndrome of the cyclic code;
    by using the initial syndrome and w pre-stored successive shift operators, calculating respectively w successive shift syndromes in a w-bit window of the cyclic code in parallel;
    determining an actual error in the cyclic code exists based on the obtained shift syndromes, wherein the determining the actual error in the cyclic code exists comprises determining whether the actual error is correctable;
    correcting the cyclic code based on the determined actual error being correctable;
    sending a signal of an uncorrectable error detected based on the determined actual error not being correctable;
    estimating whether a likelihood of an error in the cyclic code exists based on the obtained shift syndromes, wherein the estimating whether the likelihood of the error in the cyclic code exists comprises determining a likelihood result of error correction; and
    sending the signal of the uncorrectable error detected with the likelihood result of error correction.

2. The method according to claim 1, wherein the window width w is a power of 2.

3. The method according to claim 1, wherein said window width w successive shift operators are $x^i$ mod g(x), where i=1, 2, ..., w, and g(x) is the generator polynomial of the cyclic code.

4. The method according to claim 1, wherein said w successive shift operators are $x^{-i}$ mod g(x), where i=1, 2, ..., w, and g(x) is the generator polynomial of the cyclic code.

5. The method according to claim 1, further comprising: estimating in advance errors adjacent to the beginning and/or the end of the cyclic code.

6. The method according to claim 1, wherein said determining error in the cyclic code based on the obtained shift syndromes comprises: obtaining all shift syndromes corresponding to the cyclic code by shifting the window, obtaining the shortest shift syndrome by comparing all the shift syndromes, and estimating error code in the cyclic code according to the shortest shift syndrome.

7. An apparatus for decoding cyclic code, comprising:
    a receiving unit, configured to receive a transmitted cyclic code;
    an initial syndrome obtaining unit, configured to calculate the initial syndrome of the cyclic code;
    a window processing unit, configured to, by using the initial syndrome and window width w pre-stored successive shift operators, obtain respectively in parallel window width w successive shift syndromes in a w-bit window of the cyclic code;
    an error detecting and locating unit, configured to determine an actual error in the cyclic code exists based on the obtained shift syndromes, wherein the determining the actual error exists in the cyclic code comprises determining whether the actual error is correctable;
    an error correcting circuit, configured to, correct the cyclic code based on the determined actual error being correctable;
    a decoding process, configured to, send a signal of an uncorrectable error detected based on the determined actual error not being correctable;
    an error estimating unit, configured to, estimate whether a likelihood of an error in the cyclic code exists based on the obtained shift syndromes, wherein the estimating whether the likelihood of the error in the cyclic code exists comprises determining a likelihood result of error correction; and
    a decoding process, configured to, send the signal of the uncorrectable error detected with the likelihood result of error correction.

8. The apparatus according to claim 7, wherein the window width w is a power of 2.

9. The apparatus according to claim 7, wherein said window width w successive shift operators are $x^i$ mod g(x), where i=1, 2, ..., w, and g(x) is the generator polynomial of the cyclic code.

10. The apparatus according to claim 7, wherein said window width w successive shift operators are $x^{-i}$ mod g(x), where i=1, 2, ..., w, and g(x) is the generator polynomial of the cyclic code.

11. The apparatus according to claim 7, further comprising an error predicting unit, configured to estimate in advance errors adjacent to the beginning and/or the end of the cyclic code.

12. The apparatus according to claim 7, further comprising an error estimating unit, configured to obtain all shift syndromes corresponding to the cyclic code by shifting the window, obtain the shortest shift syndrome by comparing all the shift syndromes, and estimate error code in the cyclic code according to the shortest shift syndrome.

13. A decoder for decoding cyclic code, comprising:
    a data buffer for storing received cyclic code and initial syndrome;
    a parallel computing circuit, comprising w multipliers, for applying w prestored successive shift operators to the initial syndrome, and thus outputting in parallel w successive shift syndromes in a w-bit window of the cyclic code;
    an error detecting circuit, comprising a zero detecting module, for detecting the number of zeros in the syndromes and outputting error pattern based on the detecting result, wherein the detecting the number of zeros in the syndromes comprises determining whether the outputted error pattern is correctable;

an error correcting circuit, configured to, correct the cyclic code based on the determined outputted error pattern being correctable;
a decoding process, configured to, send a signal of an uncorrectable error detected based on the outputted error pattern not being correctable;
an error estimating unit, configured to, estimate whether a likelihood of an error in the cyclic code exists based on the shift syndromes, wherein the estimating whether the likelihood of the error in the cyclic code exists comprises determining a likelihood result of error correction; and
a decoding process, configured to, send the signal of the uncorrectable error detected with the likelihood result of error correction.

14. The decoder according to claim 13, wherein window width w is a power of 2.

15. The decoder according to claim 13, wherein said w successive shift operators are $x^i$ mod $g(x)$, where i=1, 2, ..., w, and $g(x)$ is the generator polynomial of the cyclic code.

16. The decoder according to claim 13, wherein said w successive shift operators are $x^{-i}$ mod $g(x)$, where i=1, 2, ..., w, and $g(x)$ is the generator polynomial of the cyclic code.

17. The decoder according to claim 13, further comprising an error predicting circuit, which comprises L-1 multipliers and an error detecting module, wherein the L-1 multipliers are used to apply L-1 prestored successive shift operators and thus obtain L-1 syndromes, and wherein the error detecting module estimates in advance errors adjacent to the beginning and/or the end of the cyclic code based on the L-1 syndromes, where L is the error length corresponding to the cyclic code.

18. The decoder according to claim 17, wherein the L-1 multipliers apply the shift operators $x^i$ mod $g(x)$ to the initial syndrome, respectively, thus obtaining L-1 syndromes, where i=1, 2, ..., L-1, and $g(x)$ is the generator polynomial of the cyclic code, and wherein the error detecting module determines errors adjacent to the end of the cyclic code based on the obtained L-1 syndromes.

19. The decoder according to claim 17, wherein the L-1 multipliers apply the shift operators $x^{-i}$ mod $g(x)$ to the initial syndrome, respectively, thus obtaining L-1 syndromes, where i=1, 2, ..., L-1, and $g(x)$ is the generator polynomial of the cyclic code, and wherein the error detecting module determines errors adjacent to the beginning of the cyclic code based on the obtained L-1 syndromes.

20. The decoder according to claim 13, further comprising an error estimating circuit, which comprises w 1-counting modules, a plurality of comparators and a minimum counter, wherein the w 1-counting modules count the numbers of is in the w shift syndromes, and the plurality of comparators compare the counting of the w 1-counters, and store the shortest shift syndrome into the minimum counter.

* * * * *